United States Patent [19]

Liaw et al.

[11] Patent Number: 5,532,178
[45] Date of Patent: Jul. 2, 1996

[54] GATE PROCESS FOR NMOS ESD PROTECTION CIRCUITS

[75] Inventors: Shiou H. Liaw; Jiaw-Ren Shih, both of Hsin-chu, Taiwan

[73] Assignee: Taiwan Semiconductor Manufacturing Company, Hsinchu, Taiwan

[21] Appl. No.: 429,726

[22] Filed: Apr. 27, 1995

[51] Int. Cl.$^6$ ................................................. H01L 21/70
[52] U.S. Cl. .................. 437/57; 437/34; 437/44; 437/41; 257/360
[58] Field of Search ................... 437/57, 34, 44, 437/41 GS; 257/360

[56] References Cited

U.S. PATENT DOCUMENTS

| | | | |
|---|---|---|---|
| 4,692,834 | 9/1987 | Iwahashi et al. | 361/91 |
| 5,208,475 | 5/1993 | Mortensen | 257/360 |
| 5,262,344 | 11/1993 | Mistry | 437/57 |
| 5,301,084 | 4/1994 | Miller | 361/91 |

*Primary Examiner*—Tom Thomas
*Assistant Examiner*—Lynn A. Gurley
*Attorney, Agent, or Firm*—George O. Saile; William J. Stoffel

[57] ABSTRACT

An improved process and integrated-circuit having CMOS (NMOS and/or PMOS) devices formed on a substrate and a NMOS electro static discharge circuit formed in a P well on the substrate. The improvement includes an electro static discharge NMOS circuit having an undoped polysilicon gate electrode, and the NMOS FET devices having n-type doped gate electrodes. The undoped polysilicon gate electrode of the electro static discharge transistor increases the gate oxide breakdown voltage thus making the ESD transistor able to withstand a greater voltage discharge and therefore providing better protection to the product devices.

14 Claims, 4 Drawing Sheets

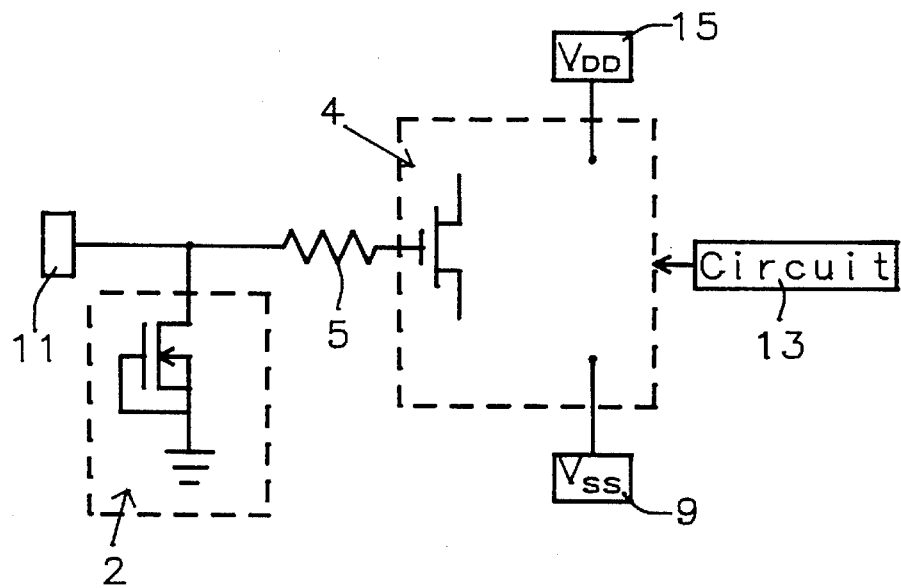
FIG. 1 - Prior Art
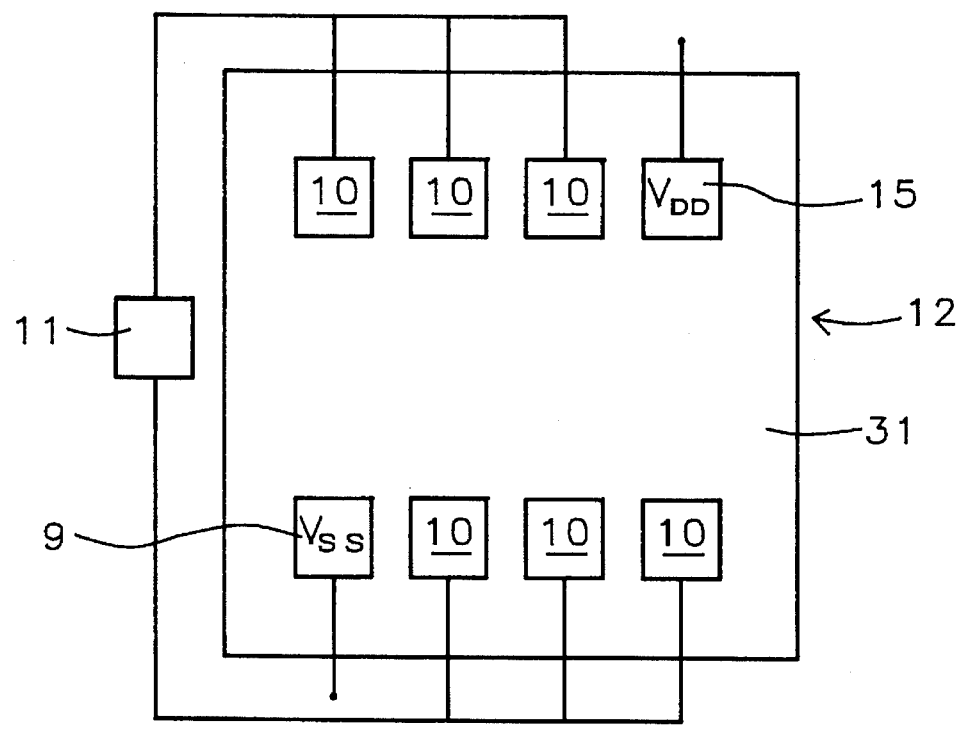
FIG. 2

5,532,178

GATE PROCESS FOR NMOS ESD PROTECTION CIRCUITS

BACKGROUND OF INVENTION

1) Field of the Invention

This invention relates to semiconductor devices and more particularly to an improved method of producing electro static discharge (ESD) protection circuits.

2) Description of the Prior Art

A person taking an integrated circuit from its plastic wrapping material or walking across a room can generate up to 20,000 V. This effect is cause by triboelectricity—the electrical produced by rubbing two materials together. A triboelectric discharge in to a semiconductor integrated circuit can damage the circuit enough to cause either immediate or subsequent early life failure.

Although one can use proper preventative care during handling, an electro static discharge of hundreds of volts can occur. Circuit designers place protective networks on the input and output circuits on a chip to furnish an electrical path for discharge thereby preventing the generation of large voltages across the gate oxides of the input circuit devices.

FIG. 1 shows an ESD protection circuit 2 typically formed of a NMOS transistor having a wide channel width. FIG. 1 shows an input terminal 11, ESD circuit 2, resistor 5, $V_{dd}$ 15, $V_{ss}$ 9 and circuit input 13. Without a working ESD protection circuit 2, when a large voltage is discharged into the input terminal 11, it would pass through the product device transistor 4 and damage the gate oxide of the transistor 4. A working ESD circuit 2 would protect the transistor 4 from the high voltage discharge.

VLSI circuit manufactures are making devices with thinner gate oxide layers to increase the device speeds. Therefore, gate oxide thicknesses are being continuously reduced. The gate oxide in present circuits is approximately 100 Å thick or less and will be thinner in future circuits. The dielectric breakdown strength of silicon dioxide ($SiO_2$) is approximately 8 MV/cm. Therefore, a 100 Å thick gate oxide will not sustain voltages more than about 8 Volts. In actual practice, gate oxides are thinner than 100 Å and process variables make the gate oxides thinner in spots causing the actual sustainable voltage to be well below 8 V. This 8 V breakdown is less than junction breakdown voltages. These lower gate oxide breakdown voltages cause problems, especially in the gate oxides in the ESD protection circuit because ESD transient operating voltages are higher than the gate oxide breakdown voltage. When the gate oxide in the protection circuit breaks down, the ESD protection circuit does not function to protect the device circuit.

Therefore, as thinner gate oxides are used, the gate oxides in the ESD protection circuits are breaking down thus not allowing the ESD circuit to protect the input device circuits 13. The primary failure mechanisms of gate oxides in ESD protection circuit are thermal run-away at the drain junction and gate oxide breakdown. Recent studies have shown that gate oxide breakdown happens before the drain junction breakdown, especially using a thin gate oxide with a thickness less than 100 Å. Using the conventional one step gate oxidation process, one uniform gate oxide layer is formed over the entire substrate so that the ESD circuit devices have the same gate oxide thicknesses as the input circuit product devices. Therefore, the solution of increasing the gate oxide thickness for the ESD circuit, while maintaining the current device circuit gate oxide thickness (~80 to 100 Å), is not possible with the conventional one step gate oxidation process.

Therefore, there is a need to develop a process that will provide a higher gate oxide breakdown voltage ($V_g$) on ESD circuit transistors while maintaining thin gate oxide thickness for product CMOS device circuits.

SUMMARY OF THE INVENTION

It is an object of the present invention to provide a device and method of forming an electro static discharge (ESD) protection circuit which has increased gate oxide breakdown voltages.

It is an object of the present invention to provide a method of a forming complementary metal oxide semiconductor (CMOS) input circuit and a N-type Metal Oxide Semiconductor (NMOS) ESD circuit which has an increased gate oxide breakdown voltage without increasing the gate oxide thickness.

It is yet another object of the present invention to provide a method of a forming CMOS product transistors and a N-type Metal Oxide Semiconductor (NMOS) ESD circuit by not allowing N+ impurities to dope the N gate of the ESD N MOS devices thus increasing the device breakdown voltages.

In accordance with the above objectives, a device and process for simultaneously fabricating CMOS input device circuits on a semiconductor substrate and an NMOS ESD Protection circuit device product areas on the substrate is provided. The device of the present invention provides an improved integrated-circuit having CMOS FET devices formed on a substrate and a NMOS electro static discharge circuit formed with an undoped polysilicon gate electrode on the substrate. The improvement consists of the NMOS electro static discharge circuit with an undoped polysilicon gate electrode combined with CMOS devices (PMOS and NMOS) which may have doped gate electrodes.

In the process of the current invention, the substrate preferably has a n-type background conductivity. Using conventional processes, P wells are formed in ESD circuit areas where the NMOS ESD devices will be formed. Product areas (e.g., the remaining substrate areas) are used to form other devices including product devices. Next, field oxide regions are formed in the substrate using conventional masking and oxidation techniques. A gate insulating layer is formed on the surface of the semiconductor substrate. A polysilicon layer is formed on the gate insulating film. Next, a tungsten silicide layer is formed over the polysilicon layer.

A photoresist layer is then formed on the tungsten silicide layer covering at least the layers over ESD circuit areas where the ESD transistors will be formed. N+ impurities are implanted into the tungsten silicide and polysilicon layer using the photo resist layer as a mask so that the ions are not implanted into ESD circuit areas which contain NMOS ESD devices. The N+ implant dopes the tungsten silicide layer in the product areas. The photo resist is then removed.

Next, NMOS ESD protection circuit devices with undoped gate electrodes are formed the ESD circuit areas and CMOS devices (e.g., NMOS and PMOS) including some devices with n+ doped gates are formed in the product areas on the substrate (chip). In both the ESD circuit areas and in the product areas, the polysilicon layer is patterned into gate electrodes having vertical sidewalls and a top surface. N– impurities are introduced into the substrate using the gate electrode as a mask to form lightly doped source/drain regions.

Subsequently, sidewall spacers are formed on the on the sidewalls of the gate electrodes. N+ impurities are introduced into p-well using the gate electrode and the sidewall spacers as a mask to form an highly doped source/drain regions. Subsequently, a dielectric layer is formed over the substrate. Optionally, PMOS product devices can be formed in the product areas by masking the PMOS source and drain areas during the N implants. Them the N source/drain areas are masked during P implants which form the corresponding lightly and highly doped source and drain regions for the PMOS devices.

Contacts to the sources, drains, and gate electrodes are formed through the dielectric layer. Metal interconnection and passivation layers are formed to connect the devices in a circuit thereby completing the NMOS ESD protection circuit and CMOS input product devices.

BRIEF DESCRIPTION OF THE DRAWINGS

The drawings show the following:

FIG. 1 shows a schematic of an ESD protection circuit of the prior art.

FIG. 2 shows a top plan view of a chip having an ESD protection circuit and device circuits fabricated according to the method of the present invention.

DETAILED DESCRIPTION OF THE PREFERRED EMBODIMENTS

Figure 3:
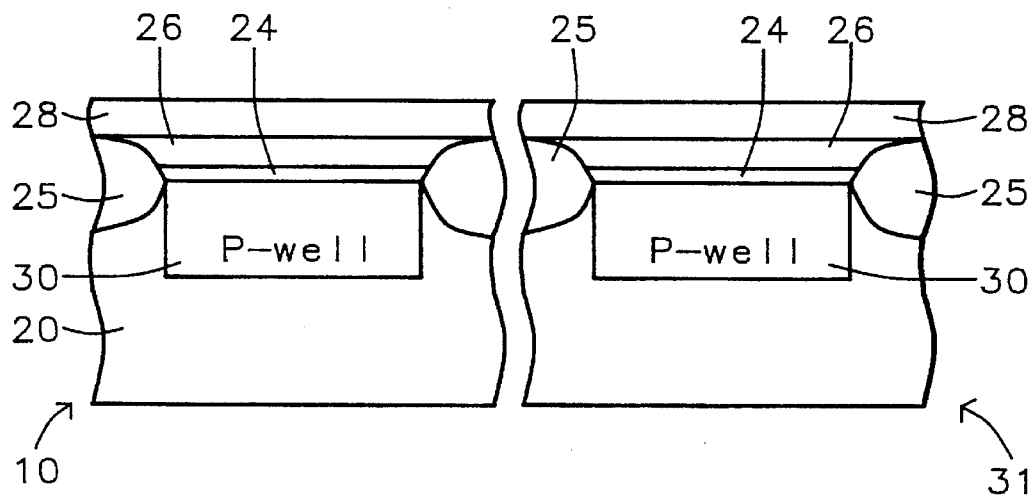
FIGS. 3 through 6 show cross sectional representations of the process of the current invention for forming an improved NMOS ESD protection device in a p-well.

According to the present process, as shown in FIGS. 2 through 7, a process for simultaneously fabricating CMOS input product device circuits in product areas on a semiconductor substrate and an NMOS ESD Protection circuit device with an undoped polysilicon gate electrode in ESD circuit areas in the substrate 20 is provided. The invention can also be applied to form the opposite type devices, i.e., PMOS ESD devices with CMOS product circuits. The present invention will be described in detail with reference to the accompanying drawings. It should be noted that the drawings are in greatly simplified form. In practice the semiconductor device/circuit will be one of many supported on a common substrate connected with suitable metallurgy in various electronic electric circuit configurations. As shown in FIG. 3, the substrate 20 shall be a monocrystalline silicon semiconductor body with many devices fabricated therein, as is well known in the art. The substrate 20 is preferably formed of monocrystalline silicon preferably having a crystalline orientation of <100>.

Figure 6:
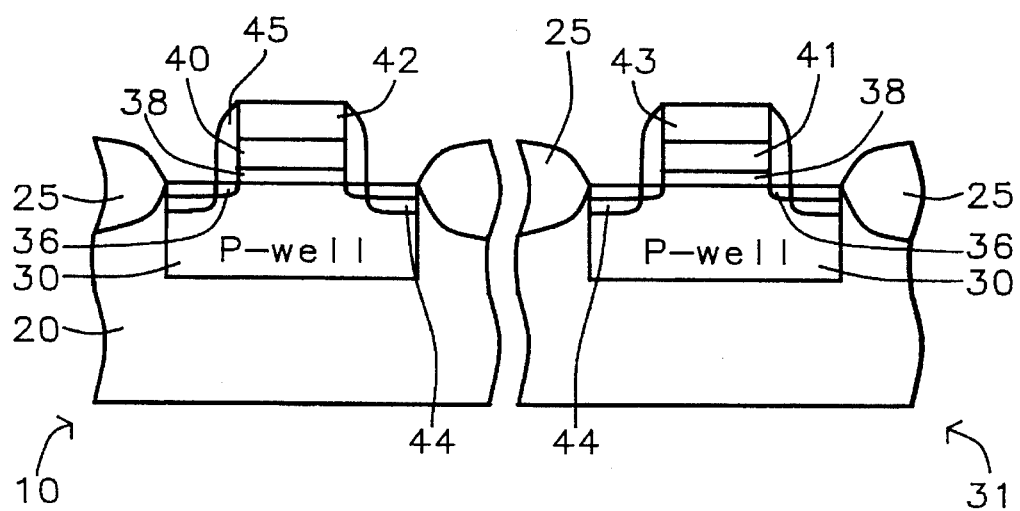
Figure 7:
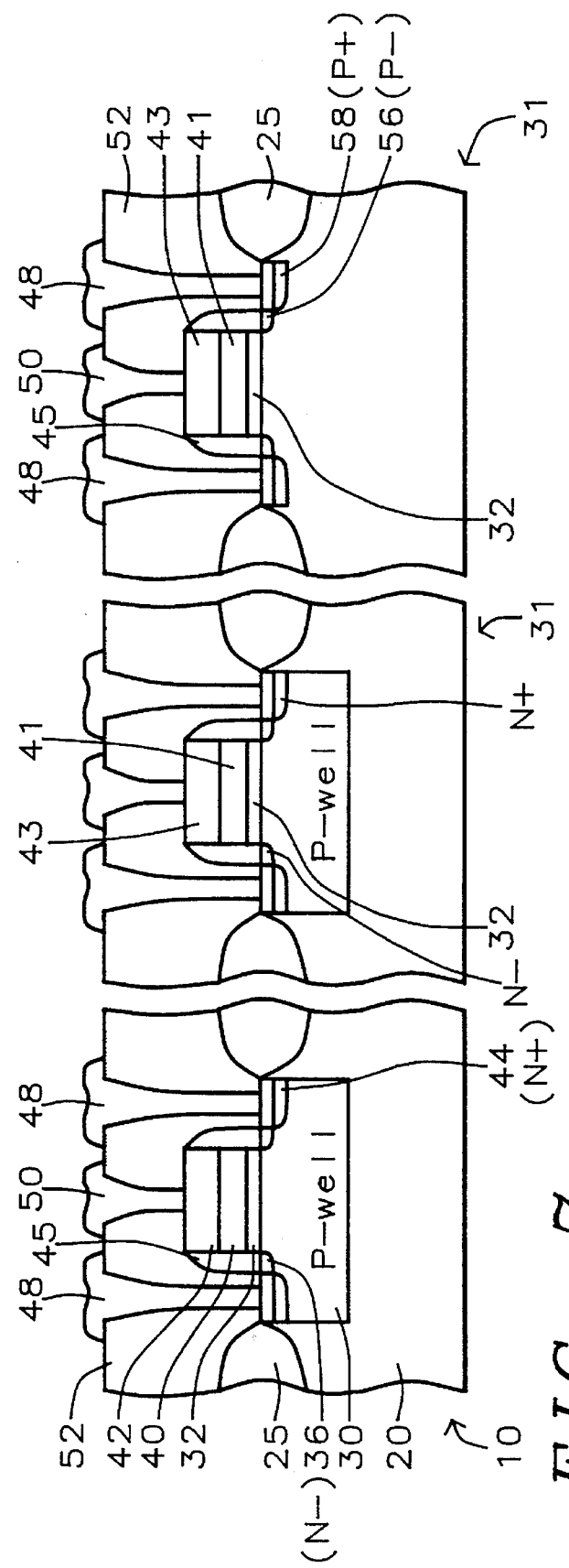
FIG. 7 shows a cross sectional representation of the process of the current invention for forming an improved NMOS ESD protection device in an ESD circuit area and both NMOS and PMOS product devices in product areas.

The substrate 20 has ESD circuit areas 10 with P-wells 30 in which the NMOS ESD devices are formed and product areas 31 where CMOS product devices are formed as shown in FIG. 3. For this illustration, (FIGS. 3 through 6) NMOS device will be shown formed in CMOS areas 31, but NMOS and/or PMOS device can also be formed in area 31 (as shown in FIG. 7). The p well 30 has a concentration in the range of 2E16 to 5E16 atoms/cc. FIG. 2 shows a top down view of CMOS product device regions 31 which are formed over the substrate 12 and NMOS ESD device areas 10 which are formed in p-wells. CMOS product areas 10 can be NMOS devices which can be formed in p wells or PMOS devices formed in the substrate.

As shown in FIG. 3, field oxide regions 25 are formed in the substrate 20 using conventional masking and oxidation processes. A gate insulating layer 24 is formed on the surface of the semiconductor substrate 20. The gate insulating layer 24 can have a thickness in the range of about 50 to 150 Å. A polysilicon layer 26 is formed on the gate insulating film. The polysilicon layer 26 can have a thickness in the range of about 1000 to 3000 Å. Next a tungsten silicide layer 28 is formed over the polysilicon layer 26. The tungsten silicide layer has a thickness in the range of about 1000 to 3000 Å. The tungsten silicide layer can be formed by depositing a tungsten layer over the polysilicon layer by a $WF_6$ chemical vapor deposition sputter process.

Figure 4:
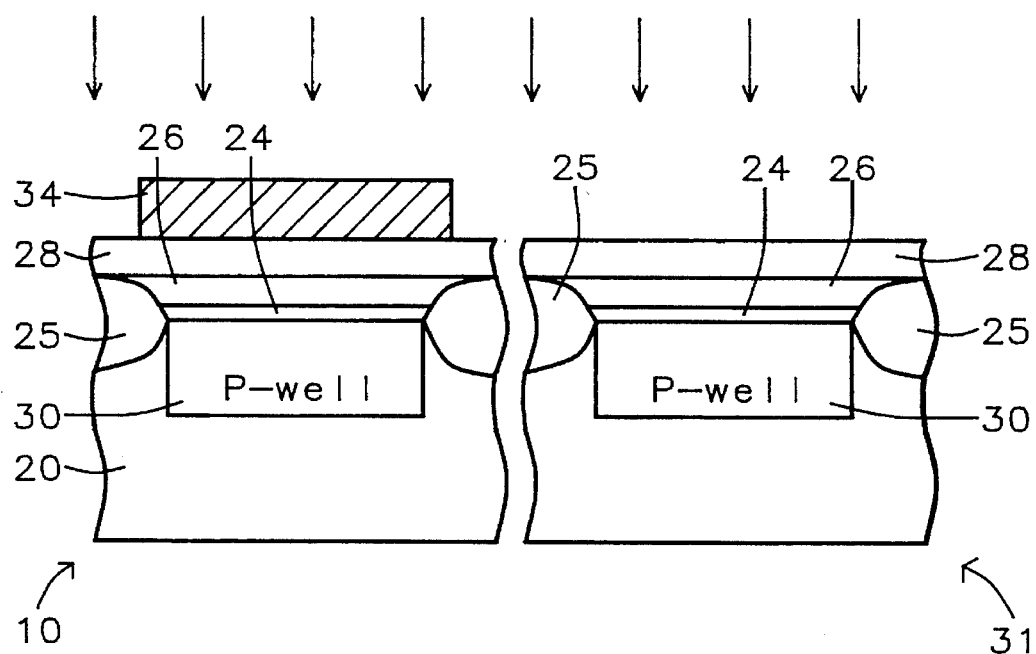

Then a photoresist layer 34 is formed on the tungsten silicide 28 layer covering at least the ESD circuit area 10 and is not formed over product areas 31 on the substrate where CMOS devices (e.g., NMOS) will be formed as shown in FIG. 4. N+ impurities are implanted into the tungsten silicide 28 and polysilicon layers 26, where CMOS devices (e.g., NMOS) will be formed, using the photoresist 34 as a mask so that the ions are not implanted into tungsten silicide in ESD circuit area 10 or in product areas 31 where the N implant is not wanted, such as in PMOS device areas. The implantation of N+ impurities into tungsten silicide 28 and polysilicon layer 26 is performed by implanting phosphorus ions with an energy in the range of about 60 to 150 Kev and a dose in the range of about 1E15 to 1E16 atoms/sq. cm. The implantation of N+ impurities into tungsten silicide and polysilicon layer forms a N+ layer in the tungsten silicide and polysilicon layer with a concentration in the range of about 5E14 to 1E21 atoms/cc.

The photo resist layer 34 is removed. Next, NMOS ESD protection circuit devices are formed in the ESD circuit areas 10 and CMOS devices (NMOS and/or PMOS) are formed in product areas 31 of the substrate (chip). The FIGS. 3 through 6 show NMOS product devices formed in areas 31 but both NMOS and PMOS devices can be formed as shown in FIG. 7.

Figure 5:
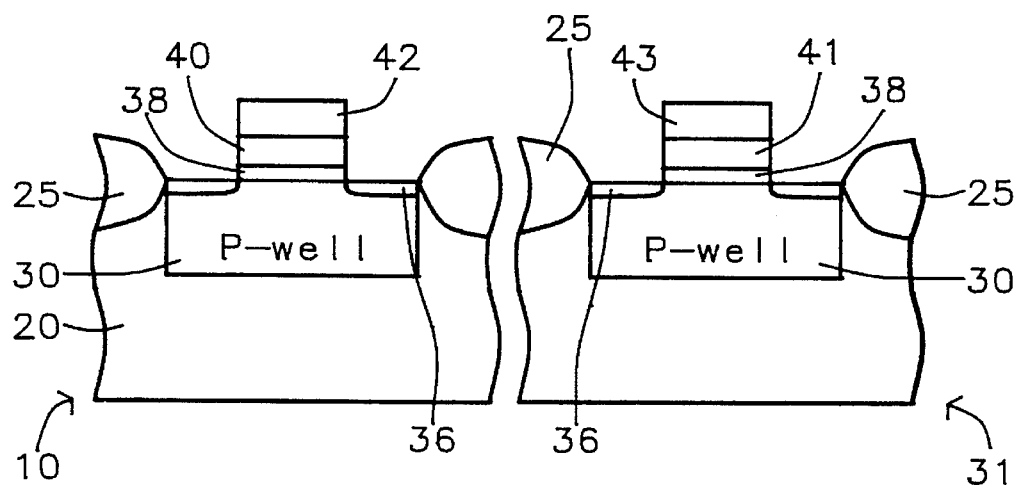

As shown in FIG. 5, in the ESD device regions 10 and the CMOS device regions 31, the polysilicon layer 26 and tungsten silicide layer 28 are patterned into a gate electrodes (ESD gate electrodes 40, 42 and NMOS gate electrodes 41, 43) having vertical sidewalls and a top surface. If PMOS product devices are being formed, the PMOS source and drain regions are masked. N– impurities are introduced into the substrate 20 using the gate electrodes 40, 42, 41, 43 as a mask to form lightly doped source/drain regions 36. The introduction of impurities is performed by ion implanting phosphorus ions with an energy in the range of about 20 to 60 Kev and a dose in the range of about 5E12 to 1E14 atom/cm$^2$. The lightly doped source/drain regions 36 can have a concentration in the range of about 1E17 to 1E19 atom/cc. If PMOS devices are being formed, a photo resist layer is formed covering the NMOS devices and a P implant forms lightly doped source and drain regions 56 as shown in FIG. 7.

A first insulating film (not shown) is formed on the surface of the semiconductor substrate, p-well, and on the surface of the gate electrode 42, 40. The first insulating film has a thickness in the range of about 1000 to 3500 Å. The first insulating film is patterned to form sidewall spacers 45 on the sidewalls of the gate electrodes 40, 42, 41, 43 by anisotropic etching of the first insulating film as shown in FIGS. 6 and 7.

Subsequently, impurities are introduced into the substrate using the gate electrodes 40, 42, 41,43 and the sidewall spacers 45 as a mask to form highly doped source/drain regions 44. If PMOS device are being formed, a mask covers the PMOS devices during the N implant. The introduction of impurities can be performed by ion implanting As ions with an energy in the range of about 30 to 70 Kev. and a dose in the range of about 1E15 to 6E15 atom/cm$^2$. The highly doped source/drain regions 44 have a concentration in the range of about 1E20 to 1E21 atom/cc. If PMOS devices are being formed, a mask layer is formed that covers the NMOS devices and a P implant forms the P highly doped source and drain regions 58 as shown in FIG. 7. The mask is then removed.

Subsequently, a dielectric layer 52 is formed over the substrate. The dielectric layer can be formed of borophosphosilicate (BPSG) glass. Contacts 48, 50 to the source, drain and gate electrode are formed through the dielectric layer 52. As shown in FIG. 7, both PMOS and NMOS transistors can be formed in the product areas 31. FIG. 7 shows a PMOS transistor having (p–) lightly doped source/drain regions 56, (p+) highly doped source/drain regions 58, gate insulating layer 32, gate electrode 41, 43, and contacts 48, 50. The PMOS product devices is formed with the same process steps as the ESD devices and include extra masking and implant steps to form the P lightly doped and highly doped source/drain regions 56, 58. The P type lightly and highly doped source/drain regions 56, 58 are formed with separate P+ implant steps while the NMOS transistors are masked by a photo resist. Also, the P type source and drain regions 56, 58 are masked during the N implants.

Lastly, passivation layers and metal interconnect layers (i.e., a metallurgy pattern) are formed to connect the devices in a circuit thereby completing the CMOS product devices and the NMOS ESD protection circuit having an undoped polysilicon gate electrode.

Conventional NMOS ESD circuits have highly doped N+ gate electrodes which improve the product device performance but reduce the Vg causing ESD circuit reliability problems. The present invention provides fabrication of undoped polysilicon ESD gate electrodes ensuring ESD circuit reliability while forming N+ doped gate electrodes in the NMOS product circuits which improves product performance.

The device of the present invention provides an improved integrated-circuit having CMOS FET devices formed on a substrate and a PMOS electro static discharge (ESD) circuit formed in P wells on the substrate. The undoped polysilicon gates of the NMOS ESD circuit give the NMOS devices a higher gate breakdown voltage Vg that ensures that the ESD circuit will protect the product devices. The undoped polysilicon gate electrode of the present invention also allows the use of thinner gate oxides thereby increasing the speed of the product devices. This invention is applicable to a wide range of circuit types that use ESD circuits, such as RAM, ROM, and logic circuits.

While the invention has been particularly shown and described with reference to the preferred embodiments thereof, it will be understood by those skilled in the art that various changes in form and details may be made without departing from the spirit and scope of the invention.

What is claimed is:

1. The method of simultaneously fabricating CMOS input product device circuits having n+ doped gate electrodes in product areas on a semiconductor substrate and an NMOS ESD protection circuit in ESD circuit areas, the NMOS ESD protection circuit having an undoped polysilicon gate electrode, the semiconductor substrate having a n-type background conductivity type, the method which comprises:

forming p wells in the substrate in product areas and in ESD circuit areas;

forming a gate insulating layer on the surface of the semiconductor substrate;

forming a polysilicon layer on said gate insulating layer;

forming a tungsten silicide layer over said polysilicon layer;

forming a photoresist layer on said tungsten silicide layer covering ESD circuit areas;

implanting N+ impurity ions into said tungsten silicide layer and polysilicon layer using said photoresist layer as a mask thereby forming a N+ doped tungsten silicide layer in the product areas wherein said N+ impurity ions are not implanted into said tungsten silicide layer and said polysilicon layer in the ESD circuit areas;

removing the photo resist layer;

patterning said polysilicon layer and said tungsten silicide layer into gate electrodes having vertical sidewalls and a top surface in said product areas and said ESD circuit areas;

implanting ions into the substrate forming lightly doped source and drain regions;

forming spacers on the vertical sidewalls of said gate electrodes;

ion implanting impurities into the substrate using said spacers as masks forming highly doped source and drain regions;

forming a dielectric layer over the substrate;

forming contacts to said highly doped source and drain regions, and said gate electrodes through the dielectric layer; and forming an interconnecting metallurgy pattern that connects said highly doped source regions, drain regions, and gate electrodes thereby completing the NMOS ESD protection circuit and the CMOS product device circuits.

2. The method of claim 1 wherein said gate insulating layer has a thickness in the range of about 50 to 150 Å.

3. The method of claim 1 wherein said polysilicon layer has a thickness in the range of about 1000 to 3000 Å.

4. The method of claim 1 wherein said p wells have a concentration in the range of about 2E16 to 5E16 atoms/cc.

5. The method of claim 1 wherein said tungsten silicide layer has a thickness in the range of about 1000 to 3000 Å.

6. The method of claim 1 wherein the implantation of N+ type impurities into tungsten silicide and polysilicon layer is performed by implanting phosphorus ions with an energy in the range of about 60 to 150 Kev, and a dose in the range of about 1E15 to 1E16 atoms/sq. cm.

7. The method of claim 1 wherein the implantation of N+ impurity ions into said tungsten silicide and polysilicon layers forms a N+ doped layer in the tungsten silicide and polysilicon layer with a concentration in the range of about 5E14 to 1E21 atoms/cc.

8. The method of claim 1 wherein introduction of impurities into said semiconductor substrate using said gate electrode as a mask to form lightly doped source/drain regions is performed by ion implanting phosphorus ions with an energy in the range of about 20 to 60 and a dose in the range of about 5E12 to 1E14 atom/sq. cm.

9. The method of claim 1 wherein the lightly doped source/drain regions have a concentration in the range of about 1E17 to 1E19 atom/cc.

10. The method of claim 1 wherein the first insulating film has a thickness in the range of about 1000 to 3500 Å.

11. The method of claim 1 wherein introduction of impurities into said semiconductor substrate using said gate electrode as a mask to form the highly doped source/drain regions is performed by ion implanting As ions with an energy in the range of about 30 to 70 Kev. and a dose in the range of about 1E15 to 6E15 atoms/sq. cm.

12. The method of claim 1 wherein the highly source/drain regions have a concentration in the range of about 1E20 to 1E21 atom/cc.

13. The method of claim 1 which further includes forming PMOS product devices in said product areas.

14. The method of claim 1 wherein the semiconductor substrate includes field oxide regions.

* * * * *